US 009783374B2

(12) United States Patent
Akimoto

(10) Patent No.: US 9,783,374 B2
(45) Date of Patent: Oct. 10, 2017

(54) FALL IMPACT REDUCING APPARATUS FOR CHIP COMPONENT AND WIRE JIG

(71) Applicant: MURATA MANUFACTURING CO., LTD., Kyoto (JP)

(72) Inventor: Shigeru Akimoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/192,467

(22) Filed: Jun. 24, 2016

(65) Prior Publication Data

US 2016/0304294 A1    Oct. 20, 2016

Related U.S. Application Data

(63) Continuation of application No. PCT/JP2014/081966, filed on Dec. 3, 2014.

(30) Foreign Application Priority Data

Dec. 26, 2013   (JP) .................................. 2013-268566

(51) Int. Cl.
*B65G 47/52* (2006.01)
*B65G 11/20* (2006.01)
(Continued)

(52) U.S. Cl.
CPC ............ *B65G 47/52* (2013.01); *B65G 11/203* (2013.01); *B65G 47/19* (2013.01); *H01G 13/00* (2013.01);
(Continued)

(58) Field of Classification Search
CPC .... B65G 11/203; B65G 11/206; B65G 47/19; B65G 47/52; B65G 69/165;
(Continued)

(56) References Cited

U.S. PATENT DOCUMENTS 3,640,366 A * 2/1972 Ross ...................... B65B 35/12
193/28
7,028,824 B1 * 4/2006 Nolin ................... B65G 11/206
193/32

FOREIGN PATENT DOCUMENTS

JP      S52-088765 U    7/1977
JP      H03-177224 A    8/1991
(Continued)

OTHER PUBLICATIONS

International Search Report from corresponding PCT/JP2014/081966 dated Mar. 3, 2015.
(Continued)

*Primary Examiner* — Gene Crawford
*Assistant Examiner* — Keith R Campbell
(74) *Attorney, Agent, or Firm* — Studebaker & Brackett PC

(57) ABSTRACT

A fall impact reducing apparatus for reducing an impact on a falling chip component includes a wire assembly which is formed by stacking a plurality of wire jigs. The wire jig includes a plurality of wires arranged parallel to each other at intervals which allows the chip component C to pass through the wire jig, and the wire jig is formed of an integral body by working a base material having a predetermined thickness, the integral body constituted of a pair of frame portions and the plurality of wires extending parallel to each other between the frame portions. When the chip component is made to fall on the wire assembly, the chip component collides with the wire of any one of wire jigs.

10 Claims, 7 Drawing Sheets

(51) Int. Cl.
  *B65G 47/19* (2006.01)
  *H05K 13/02* (2006.01)
  *H01G 13/00* (2013.01)
  *B65G 69/16* (2006.01)

(52) U.S. Cl.
  CPC ........... *H05K 13/028* (2013.01); *B65G 69/16* (2013.01); *B65G 2207/28* (2013.01); *B65G 2814/0205* (2013.01)

(58) Field of Classification Search
  CPC ............ B65G 2814/0205; B65G 69/16; B65G 2207/28; H01G 13/00; H05K 13/028
  USPC ......................................................... 193/32
  See application file for complete search history.

(56) References Cited

FOREIGN PATENT DOCUMENTS

| | | |
|---|---|---|
| JP | H07-163950 A | 6/1995 |
| JP | H08-111467 A | 4/1996 |
| JP | 2000-264432 A | 9/2000 |
| JP | 2008-081312 A | 4/2008 |
| JP | 2008-145004 A | 6/2008 |
| JP | 20931 Z1 | 6/2011 |
| KR | 2009-0032740 A | 4/2009 |
| WO | 2008/041172 A1 | 4/2008 |
| WO | 2014/061540 A1 | 4/2014 |

OTHER PUBLICATIONS

Written Opinion from corresponding PCT/JP2014/081966 dated Mar. 3, 2015.

An Office Action; "Notice of Preliminary Rejection," issued by the Korean Patent Office dated Apr. 13, 2017, which corresponds to Korean Patent Application No. 10-2016-7014889 and is related to U.S. Appl. No. 15/192,467; with English language translation.

* cited by examiner

FALL IMPACT REDUCING APPARATUS FOR CHIP COMPONENT AND WIRE JIG

CROSS REFERENCE TO RELATED APPLICATIONS

This application claims benefit of priority to Japanese Patent Application 2013-268566 filed Dec. 26, 2013, and to International Patent Application No. PCT/JP2014/081966 filed Dec. 3, 2014, the entire content of which is incorporated herein by reference.

TECHNICAL FIELD

The present disclosure relates to a fall impact reducing apparatus which reduces a fall impact on a falling chip component, and receives the chip component while suppressing breakage or deformation of the chip component. "Chip component" in this disclosure includes not only a finished chip component but also an intermediate part (for example, a molded chip or a fired chip).

BACKGROUND

In the conveyance of a chip component such as a multi-layer ceramic capacitor in the course of a manufacturing process, there arises a case where it is necessary to transfer the chip component from a conveyance line at a first given height to another conveyance line at a second given height lower than the first given height. To cope with such a case, as shown in FIG. 10, there has been known a device where a plurality of conveyance belts 101, 102, 103 are vertically arranged in multiple stages, a chip component C on the conveyance belt 101 at the uppermost stage is made to fall on the conveyance belt 102 in the next stage and, thereafter, the chip component C is made to sequentially fall on the conveyance belts in lower stages so that it is possible to convey the chip component C by reducing a fall impact on the chip component C stage by stage. Since a crack or chipping easily occurs in a chip component such as a multilayer ceramic capacitor due to a fall impact and hence, it is necessary to control a fall height H of a chip component per one stage within an allowable fall distance.

For example, when a multilayer ceramic capacitor having a rectangular parallelepiped shape of 0.5×0.5×1.0 mm makes a free fall from a height of 1 m, a falling speed is accelerated to approximately 4 m/s. When the chip component is made to collide with a rigid plate (for example, a ceramic plate) at such a speed, it is confirmed by an experiment that the chip component suffers damage such as a crack or chipping with probability of 30% or more. On the other hand, when the fall height is set to 50 mm, probability that the chip component suffers a crack or chipping is almost 0%. In this case, a falling speed is 1 m/s. From the above, an allowable fall distance of this chip component is 50 mm, and an allowable impact speed is 1 m/s. Accordingly, in a case where a chip component falls from a height exceeding 50 mm, it is necessary to take any suitable measure to reduce a fall impact.

When a chip component is made to fall on a soft elastic mat such as urethane or a sponge, the mat absorbs an impact generated by the chip component and hence, it is possible to avoid a breakage or a damage of the chip component. However, when a large number of chip components are continuously made to fall on the mat, the chip component which falls first and the chip component which falls subsequently collide with each other so that a crack or chipping occurs in the chip component due to the impact. In case of the previously-mentioned chip component having a size of 0.5×0.5×1.0 mm, the allowable relative speed at which a crack or a damage does not occur due to a collision between the chip components is approximately 2 m/s.

In the previously-mentioned conveyance apparatus which uses the belts, to prevent the chip component which falls subsequently from colliding with the chip component which falls first, it is necessary to adjust conveyance speeds of the belts. Accordingly, it is necessary to constantly drive the plurality of belts so that power energy is also increased. Further, in the case where a large number of chip components are made to fall at a stroke, there is a possibility that the occurrence of collision cannot be solved even when conveyance speeds of the belts are increased.

JP-A-2007-153576 discloses a chute apparatus of a conveyor which aims at the reduction of a fall impact. The chute apparatus includes conveyance passages arranged in plural stages in a height direction, and with respect to the respective conveyance passages vertically arranged adjacently to each other, an upstream-side end portion of the conveyance passage positioned on a lower side is rotatably connected to a downstream end portion of the conveyance passage positioned on an upper side. The chute apparatus further includes: a fall speed reducing apparatus where respective conveyance passages are inclined downward from an upstream side to a downstream side in a free state; and a wire which is provided to the conveyance passage in the lowermost stage, and performs the height adjustment of the fall speed reducing apparatus by elevating or lowering the conveyance passage.

However, the chute apparatus described in JPA-2007-153576 has drawbacks including the following drawbacks (1) to (3).

(1) It is necessary to provide the conveyance passages having considerably large lengths to acquire the sufficient reduction of a fall impact.

(2) It takes a considerable time to move the chip components since the chip components are made to fall while being moved in a zigzag manner.

(3) It is necessary to rotatably connect the plurality of conveyance passages by way of a hinge shaft and hence, the apparatus becomes large-sized and complicated.

SUMMARY

Problem to be Solved by the Disclosure

Accordingly, it is an object of the present disclosure to provide a fall impact reducing apparatus which can reduce a fall impact on an individual chip component and, at the same time, can suppress a collision between chip components even when a plurality of chip components continuously fall, and a wire jig used in the fall impact reducing apparatus.

Ways of Solving the Problem

To achieve the above-mentioned object, the present disclosure provides a fall impact reducing apparatus for reducing an impact on a falling chip component, wherein the fall impact reducing apparatus includes a wire assembly which is formed by stacking a plurality of wire jigs, and each of the wire jigs includes a plurality of wires arranged parallel to each other at intervals which allow the chip component to pass through the plurality of wires, and each of the wire jigs is formed of an integral body by working a base material having a predetermined thickness, the integral body constituted of a pair of frame portions and the plurality of wires extending parallel to each other between the frame portions.

In general, based on impulse, an impact force F generated by a collision of objects is expressed by the following formula (1).

$$F = mv/\Delta t \quad (1)$$

wherein, m is a mass of an object, v is a speed, and Δt is a collision time.

That is, the lowering of an impact force F which an object receives can be achieved by reducing a momentum of the numerator on a right side (=reduction of a speed) or by increasing a collision time of the denominator on the right side.

When a plurality of chip components are made to fall from above the wire jig, the chip component collides with any one of wires. In this case, however, the wire is deformed so that a collision time Δt between the chip component and the wire is extended whereby an impact force is reduced. For example, with respect to the chip component which collides with the wire, due to the deformation of the wire, a collision time Δt is increased several to 10 times or more compared to a case where the chip component collides with a rigid plate, and an impact force F generated by such a collision is decreased to one-severalth to 1/10 or less compared to the case where the chip component collides with the rigid plate.

In the course of passing through the wire jig formed by stacking the wires in plural layers, the chip component repeats a contact with the wire or a collision with the wire and hence, a falling speed of the chip component is reduced in a stepwise manner. Particularly, the distance between the wires in one wire jig is set to a distance which allows the chip component to pass through between the wires and hence, there is no possibility that the chip component gets stuck on the wire jig. Even when a plurality of chip components are made to continuously fall, the chip component readily passes through the wire jig and it is possible to avoid the chip component from colliding with the succeeding chip component. A speed of the chip component which passes through the wire jig on the lowermost layer is sufficiently reduced and hence, by arranging a recovery part below the wire jig on the lowermost layer, it is possible to recover the chip components without causing any cracks in chipping of the chip components.

The fall impact reducing apparatus of the present disclosure is not limited to a fall impact reducing apparatus where a chip component which makes a free fall is made to directly fall on the wire assembly, and may be a fall impact reducing apparatus where a chip component is made to fall on a wire assembly by way of a suitable speed reduction apparatus. The speed reduction apparatus may be a slide device such as a slider or a braking device such as an air blow. By making a chip component fall by way of the speed reducing apparatus, a falling speed of the chip component can be reduced in advance and hence, the stacking number of wire jigs of the wire assembly can be reduced.

The wire jig of the present disclosure is formed of an integral body which is constituted of a pair of frame portions and the plurality of wires extending parallel to each other between the frame portions by working a base material having a predetermined thickness. For example, the wire jig may be formed by etching a metal plate. When the wire jig is formed by etching, it is possible to acquire an advantageous effect that a large number of wires having a fine diameter can be manufactured with high accuracy and with a same quality at a low cost. As the metal plate, it is preferable to use a metal plate having a high mechanical strength made of Ni, an Ni alloy (Inconel), Cu, stainless steel or the like. Besides etching a metal plate, the wire jig may be manufactured by applying mechanical working such as blanking using a die, laser working or water jet working to a metal plate, a carbon fiber sheet or a resin sheet. In all these cases, provided that the wire possesses an excellent mechanical strength and excellent durability, it is possible to prevent breaking of the wire even when the wire is brought into contact with or collides with the chip component many times.

The wires may be arranged in a slackened state by fixing the frame portions of the wire jig to support members which are arranged in a spaced-apart manner with a predetermined distance therebetween in a length direction of the wires. When the wires are arranged with a predetermined tension, there is a possibility that a falling chip component impinges on the wire and springs back, and impinges on a succeeding chip component. Although it is effective to reduce a tension of the wire to avoid such a phenomenon, in case of the wire assembly where the individual wires are stretched, it is difficult to uniformly reduce a tension of the wires. According to the wire jig of the present disclosure, a plurality of wires are formed parallel to each other between a pair of frame portions and hence, the wires can be uniformly slackened by making a distance between the support members which support the frame portions narrower than the length of wires. When a chip component is brought into contact with the slackened wire, it is possible to prevent the chip component from the spring back whereby a collision between the chip component and a succeeding chip component can be avoided. Particularly, the wire jig of the present disclosure is formed of an integral body constituted of the frame portions and the wires and hence, a tension of the plurality of wires can be easily adjusted uniformly by adjusting a distance between the frame portions.

The wires extending between the frame portions of the wire jig may be formed into a curved or bent shape in a plane direction of the base material. In this case, the wire has a curved or bent structure as a whole or partially and hence, it is possible to impart elasticity to the wire per se whereby the spring back of the chip component when the chip component is brought into contact with the wire can be suppressed. A desired tension can be obtained by adjusting a rate of curved or bent portion in the length direction of the wire or a degree of curvature or bending of the wire.

The wire assembly may be formed by stacking the plurality of wire jigs with a spacer sandwiched between the frame portions, and by fastening the frame portions and the spacer to each other by a fastening device, wherein a predetermined gap is formed between the wire jigs. The wire jig of the present disclosure is formed of the base material having a predetermined thickness and hence, a thickness of the wire jig can be reduced. When such wire jigs are stacked on each other without modification, the wires of any pair of upper and lower wire jigs are made to approach each other or are brought into contact with each other and hence, there may be a case where a desired impact reducing effect cannot be acquired. In view of the above, one set of wire assemblies can be formed by stacking the wire jig in a state where the spacer is arranged between the wire jig and the frame portion and by fastening the frame portions and the spacers to each other by fastening devices. The fall impact reducing apparatus can be easily assembled by suitably combining the wire assembly.

An elongated hole extending in a direction orthogonal to a length direction of the wires may be formed in the frame portions of the wire jig, and positions of the wires of any pair of upper and lower wire jigs may be displaced from each other in a direction orthogonal to the length direction of the wires by inserting a fastening jig into the elongated hole at the time of fastening the frame portions to a support member by a fastening member. When the wire assembly is formed such that the wires of any pair of upper and lower wire jigs are aligned with each other in the vertical direction, there is a possibility that a chip component slips through all wires of the wire assembly depending on a falling posture of the chip component. In view of the above, by forming the elongated hole in the frame portions in the direction orthogonal to the length direction of the wire and by inserting the fastening jig into the elongated hole, the positions of the wires of any pair of upper and lower wire jigs can be freely adjusted. That is, the positions of the wires of any pair of upper and lower wire jigs can be displaced from each other in a direction orthogonal to the length direction of the wires and hence, in whatever posture the chip component falls, the chip component can be brought into contact with any one of the wires of the wire assembly.

In place of the elongated hole, a plurality of insertion holes arranged in a direction orthogonal to a length direction of the wires may be formed in the frame portions of the wire jig, and positions of the wires of the wire jig in a vertical direction may be displaced from each other in a direction orthogonal to the length direction of the wires by inserting a fastening jig into any one of the plurality of insertion holes at the time of fastening the frame portions to a support member by the fastening jig. In this case, the positions of the wires can be adjusted in plural stages by inserting the fastening jig into any one of the plurality of insertion holes.

Effects of the Disclosure

As has been described heretofore, according to the fall impact reducing apparatus of the present disclosure, the fall impact reducing apparatus includes the wire assembly where the wire jigs are stacked in plural layers, wherein a plurality of wires are formed parallel to each other at intervals which allows a chip component to pass through the wire jig. Accordingly, when a plurality of chip components are made to fall from above the wire assembly, the chip component collides with any one of the wires and a collision time between the chip component and the wire is extended due to a contact between the chip component and the wire and hence, an impact force is reduced. Since the chip component collides with a plurality of wires arranged vertically, a falling speed of the chip component can be reduced in a stepwise manner whereby a collision having a force lower than an allowable impact force is repeated and the chip component can be recovered without causing any cracks in or chipping of the chip component. Particularly, the wire jig is formed of an integral body constituted of the pair of frame portions and the wires which extend parallel to each other between the pair of frame portions by working a base material having a predetermined thickness and hence, it is possible to form the wire assembly where the wires are arranged with desired density by combining a plurality of wire jigs in a vertical direction.

DETAILED DESCRIPTION

First Embodiment

Figure 1:
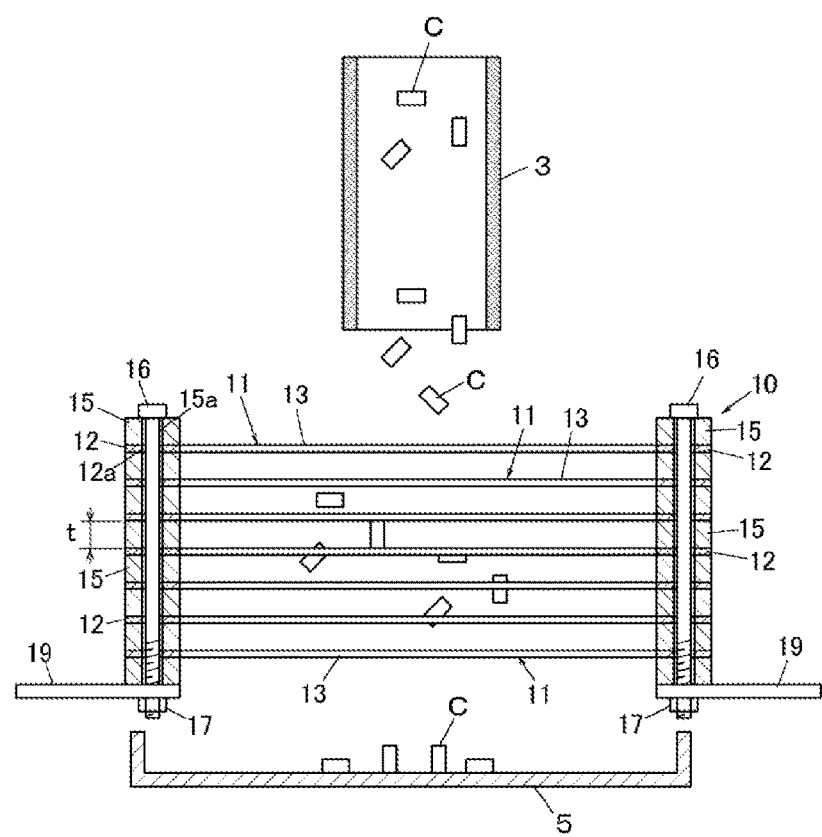
FIG. 1 is a schematic cross-sectional view of a fall impact reducing apparatus according to a first embodiment of the present disclosure.
Figure 2:
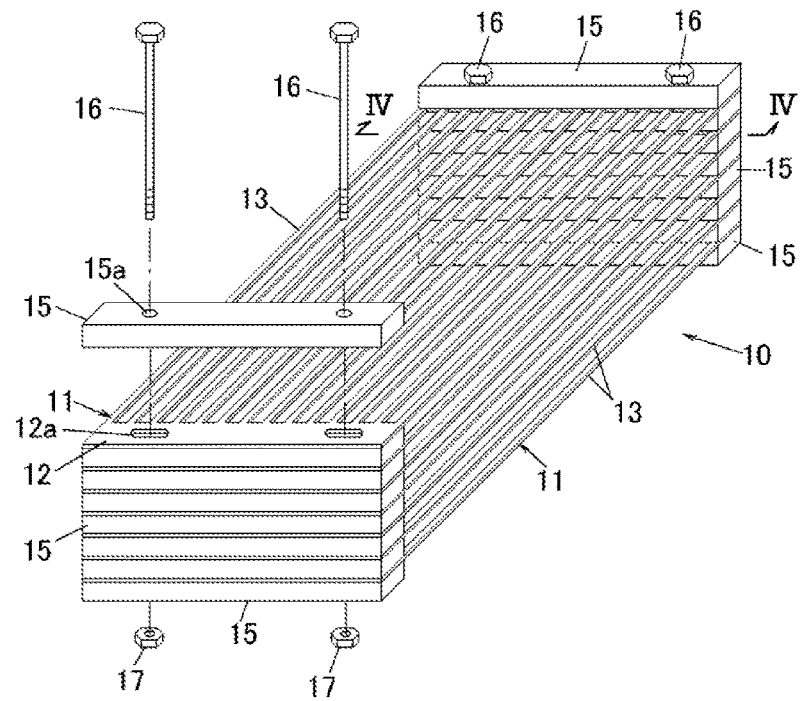
FIG. 2 is a perspective view showing one example of a wire assembly which constitutes the fall impact reducing apparatus.

FIG. 1 and FIG. 2 show a fall impact reducing apparatus according to a first embodiment of the present disclosure. An apparatus 1 is used for reducing a fall impact on a chip component C such as a multilayer ceramic capacitor having a size of 0.5×0.5×1.0 mm, for example. FIG. 1 is illustrated for facilitating the understanding of the present disclosure, and a relationship in size between the chip component C and respective members of the fall impact reducing apparatus is different from an actual relationship.

The impact reducing apparatus 1 according to this embodiment includes: a dropping cylinder 3 which guides chip components C to fall at a predetermined position; a wire assembly which receives the chip components C falling through the dropping cylinder 3, allows the chip components C to pass therethrough, and reduces a falling speed of the chip components C; and a recovery part 5 which recovers the chip components C after the chip components C pass through the wire assembly 10. The impact reducing apparatus 1 is configured such that a plurality of chip components C are continuously made to fall on the wire assembly 10 after passing through the dropping cylinder 3. The wire assembly 10 is fixed to a fixing part not shown in the drawing by way of support frames 19.

Figure 3:
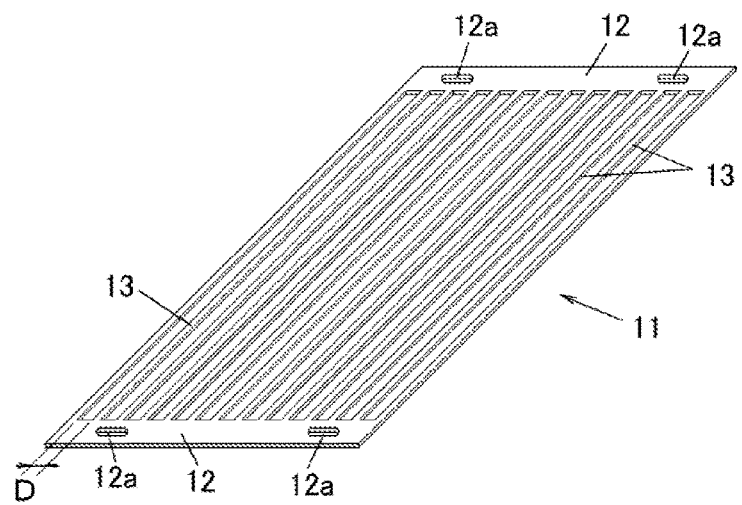
FIG. 3 is a perspective view showing one example of a wire jig.

The wire assembly 10 of this embodiment is formed by stacking a plurality of wire jigs 11 with a spacer 15 interposed between each two wire jigs 11 and by fastening and fixing these wire jigs 11 and the spacers 15 by fastening jigs. In this embodiment, bolts 16 and nuts 17 are used as the fastening jigs. In this embodiment, however, various fastening jigs can be used. For example, the bolts 16 may be threadedly engaged with the support frames 19 without using the nuts 17. In this embodiment, the bolts 16 and the nuts 17 are used in common for two purposes, that is, for fastening the wire jigs 11 and for fixing the wire assembly 10 to the support frame 19. It is needless to say, however, that individual fastening jigs may be used for fastening the wire jigs 11 and for fixing the wire assembly 10 to the support frame 19. As shown in FIG. 3, the wire jig 11 is formed by etching one metal plate, and is formed of an integral body constituted of a pair of frame portions 12 and a plurality of wires 13 extending parallel to each other between the frame portions 12. The frame portion 12 is formed into a strip shape, and a plurality of insertion holes 12a for allowing the fastening jig to pass therethrough are formed in the frame portion 12. The insertion hole 12a in this embodiment is an elongated hole elongated in a direction orthogonal to a length direction of the wires 13. A distance D between the wires 13 is set larger than a maximum size (1 mm in the case of the chip component having the above-mentioned size) of the chip component C. As the wire 13, any wire may be used provided that the wire can exhibit a sufficient buffering effect when the chip component C collides with the wire and the wire is minimally broken. A material, a diameter, a tensile strength and the like of a wire (metal plate) may be set corresponding to a weight, specific gravity or the like of a chip component C.

Figure 4:
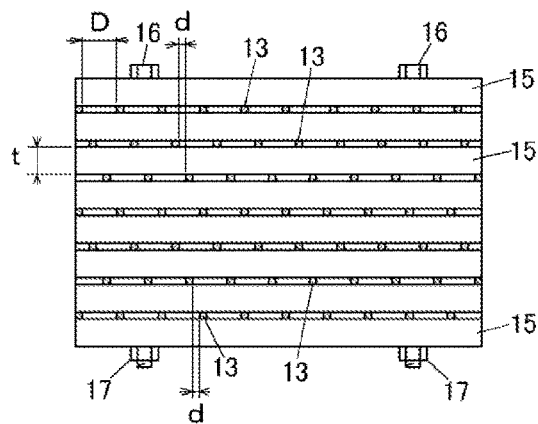
FIG. 4 is a cross-sectional view taken along a line IV-IV in FIG. 2.

A thickness t of the spacer 15 is set larger than a maximum size of the chip component C. Accordingly, there is no possibility that the chip component C is caught between the wire jigs 11 arranged adjacently to each other in a vertical direction. The insertion holes 15a each of which is formed of a circular hole and corresponds to the elongated hole 12a of the wire jig 11 are formed in the spacer 15. By inserting the fastening jigs 16 into the insertion holes 15a of the spacer 15 and the elongated holes 12a of the wire jigs 11, and by fastening the nuts 17 to the fastening jigs while adjusting positions of the respective wire jigs 11 in a direction orthogonal to the length direction of the wires 13, as shown in FIG. 4, the respective wire jigs 11 can be arranged such that the positions of the wires 13 on an upper side and the positions of the wires 13 on a lower side are displaced from each other. That is, the positions of the wires of the wire jig 11 on an upper side and the positions of the wires of the wire jig 11 on a lower side are displaced from each other in a horizontal direction such that, when the wire assembly is vertically projected on a horizontal plane, a minimum distance d between the wires in a projection view is equal to or less than a minimum size of the chip component C (in a case of the chip component having the above-mentioned size, 0.5 mm). In this case, in whatever posture the chip component C falls, it is possible to make the chip component C come into contact with or collide with any one of wires 13. An actual chip component falls while changing a posture thereof and hence, even when the wire distance d in a vertical projection view is not set to equal to or less than a minimum size of the chip component C, it is possible to make the chip component C to collide with any one of the wires. In other words, even when the wire jigs 11 which are stacked to each other in the vertical direction are not displaced from each other in the direction orthogonal to the length direction of the wire 13 (even when the wires 13 are aligned with each other in the vertical direction), it is possible to make the chip component C collide with any one of the wires 13.

The recovery part 5 is arranged below the wire assembly 10 in a spaced-apart manner with a gap equal to or less than an allowable fall distance (for example, 50 mm). Falling energy of the chip component C which has passed through the wire assembly 10 is sufficiently lowered and hence, even when the recovery part 5 is not formed using an elastic material, the chip component C can be recovered without causing a crack or chipping. The recovery part 5 is not limited to a recovery box, and may be a tray, a mesh plate, a belt conveyer or the like.

The manner of operation of the fall impact reducing apparatus 1 having the above-mentioned configuration is described. When a plurality of chip components C make a free fall continuously through the dropping cylinder 3, the chip component C comes into contact with or collides with any one of the wires 13 of the wire assembly 10. Due to the deformation of the wire 13, a collision time during which the chip component C and the wire 13 collide with each other is increased so that an impact force which the chip component C receives is reduced. Further, the chip component C collides with a plurality of wires 13 and hence, a falling speed of the chip component C is reduced in a stepwise manner, and a collision having a force lower than an allowable impact force is repeated. Accordingly, the chip component C can be recovered by the recover part 5 without causing any crack or chipping of the chip component C. A distance D between the wires of each of the wire jigs 11 is set to a distance larger than a maximum size of the chip component C and hence, the chip component C easily passes through the gap between the wires 13 so that it is possible to suppress that the chip component C remains on the wire jig 11. Accordingly, even when a plurality of chips C are made to fall continuously, the chip components C smoothly pass through the wire jigs 11 so that it is possible to prevent the chip component C from colliding with the succeeding chip component C. As a result, it is possible to prevent a crack or chipping caused by the collision of the chip components. The wire assembly 10 is formed by stacking a plurality of wire jigs 11 in plural layers. Accordingly, when the wire of a certain wire jig is broken, it is unnecessary to exchange the whole wire assembly 10. That is, it is sufficient to merely exchange the wire jig where the wire is broken. Accordingly, a cost can be reduced. Further, an exchange of the wire jig 11 can be also easily performed.

To confirm an advantageous effect of the fall impact reducing apparatus 1 having the above-mentioned configuration, the following experiment was performed. A wire jig 11 where a plurality of wires 13 having a diameter of 0.1 mm and extending parallel to each other at intervals of 2 mm are formed was prepared by etching a metal plate having a size of 300 square and a thickness of 0.1 mm. The wire assembly 10 was formed by stacking the wire jigs 11 in 20 layers with a spacer 15 having a thickness of 10 mm interposed between each two wire jigs 11. When chip components (a multilayer ceramic capacitor having a size of 0.5×0.5×1.0 mm) were made to fall from a height of 1 m above the wire assembly 10, it was possible to recover the chip components C substantially without causing a crack in or chipping of any chip component C.

Figure 5:
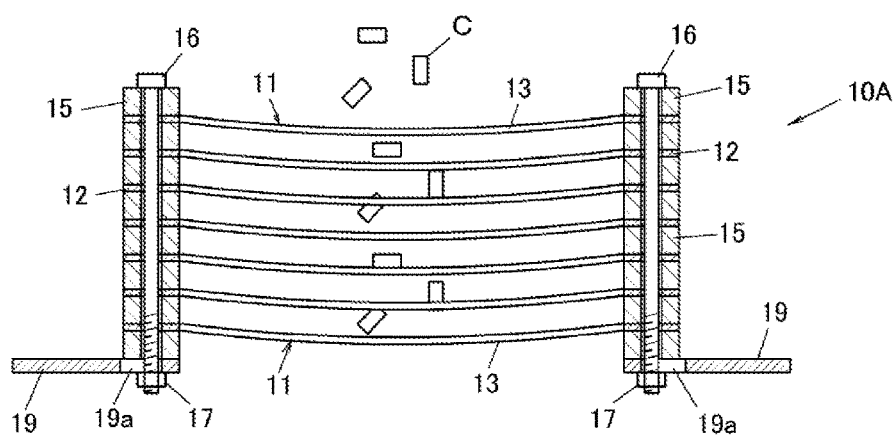
FIG. 5 is a cross-sectional view showing a state where the wire assembly is slackened.

FIG. 5 shows another use mode of the wire assembly 10. In this case, a distance between left and right spacers 15 is narrowed compared to the case shown in FIG. 1, and the wires 13 are slackened (are curved downwardly). As one example of a method of slacking the wires 13, bolt insertion holes 19a formed in the support frame 19 may have an elongated hole shape elongated in a length direction of the wires 13, and the bolts 16 may be made to pass through the bolt insertion holes 19a, and the nuts 17 may be fastened and fixed to the bolts 16 in a state where the wires 13 are slackened. In this case, tensions of a plurality of wires 13 can be uniformly alleviated and hence, the upward spring back of the chip component C when the chip component C is brought into contact with the wire 13 can be uniformly prevented. Accordingly, a collision between the chip component C which springs back and a succeeding chip component C can be avoided so that it is possible to reduce a possibility of the occurrence of a crack in or chipping of the chip component C. Here, it is unnecessary to slacken all wire jigs 11. That is, a possibility of the occurrence of a crack in or chipping of the chip component C can be effectively reduced also when only the wire jig 11 on the uppermost layer where the spring back of the chip component C is most likely to occur is slackened.

Figure 6:
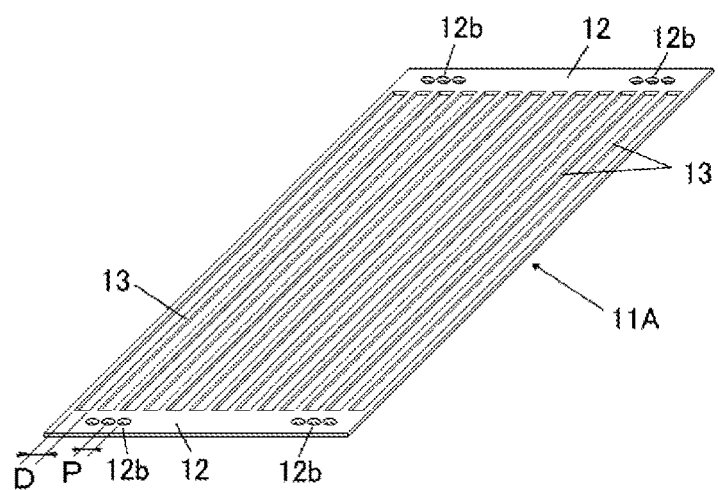
FIG. 6 is a perspective view showing a wire jig according to a second embodiment.

FIG. 6 shows a wire jig according to a second embodiment. A wire jig 11A of this embodiment is formed such that a plurality of insertion holes 12b (three insertion holes 12b in FIG. 6) which are arranged in a direction orthogonal to a length direction of the wires 13 are formed in the frame portion 12 at a predetermined pitch P in place of forming the elongated holes 12a. It is preferable that the pitch P differ from a pitch of the wires 13. In the case where the plurality of insertion holes 12b are formed in the frame portion 12 as described above, by inserting the fastening jig 16 into the insertion hole 12b at the different position, positions of the wires of any pair of upper and lower wire jigs 11 can be displaced from each other in plural stages.

Figure 7:
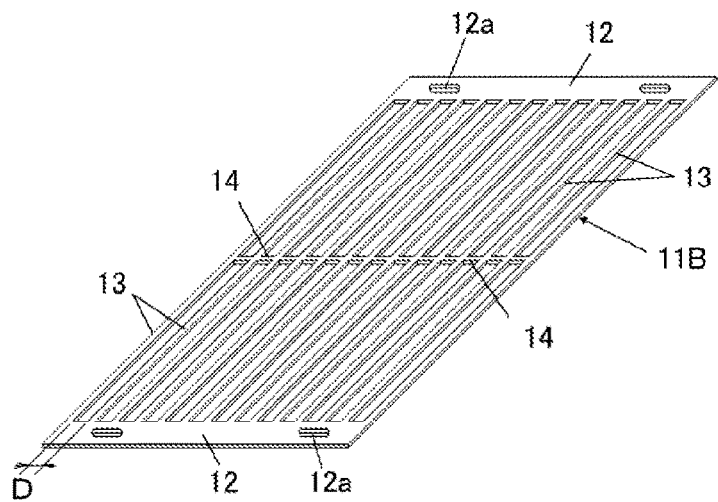
FIG. 7 is a perspective view showing a wire jig according to a third embodiment.

FIG. 7 shows a wire jig according to a third embodiment. In a wire jig 11B of this embodiment, intermediate portions of the plurality of wires 13 are connected to each other by a connecting portion 14 extending in a direction orthogonal to an axial direction of the wires 13. It is desirable to make a width of the connecting portion 14 as small as possible by taking into account the case where a chip component collides with the connecting portion 14. The width of the connecting portion 14 may be set substantially equal to a width of the wire 13. By adding the connecting portion 14 to the wire jig 11B as described above, when the wires 13 are slackened, the occurrence of irregularity in distance D between the wires 13 can be eliminated. The number of connecting portion 14 may be set as desired. However, the number of connecting portions 14 is not limited to one, and the number of connecting portions 14 may be increased to two or more when a length of the wires 13 is increased.

In the wire assembly 10 of the above-mentioned embodiment, the directions along which the wires of all wire jigs 11 arranged in a vertical direction are parallel to each other. However, the direction of the wires of one wire jig 11 may be arranged in a direction orthogonal to the direction of the wires of other wire jigs 11. For example, the configuration may be adopted where the spacer 15 is formed into a rectangular frame shape, and the wire jigs 11 arranged above and below the spacer are displaced from each other by 90° and are fixed to the spacer 15. Further, wire jigs 11, 11A, 11B described in FIG. 3, FIG. 6 and FIG. 7 may be used for forming an upper portion of the wire assembly 10, and wire jigs different from these wire jigs 11, 11A, 11B may be used for forming a lower portion of the wire assembly 10.

Second Embodiment

Figure 8:
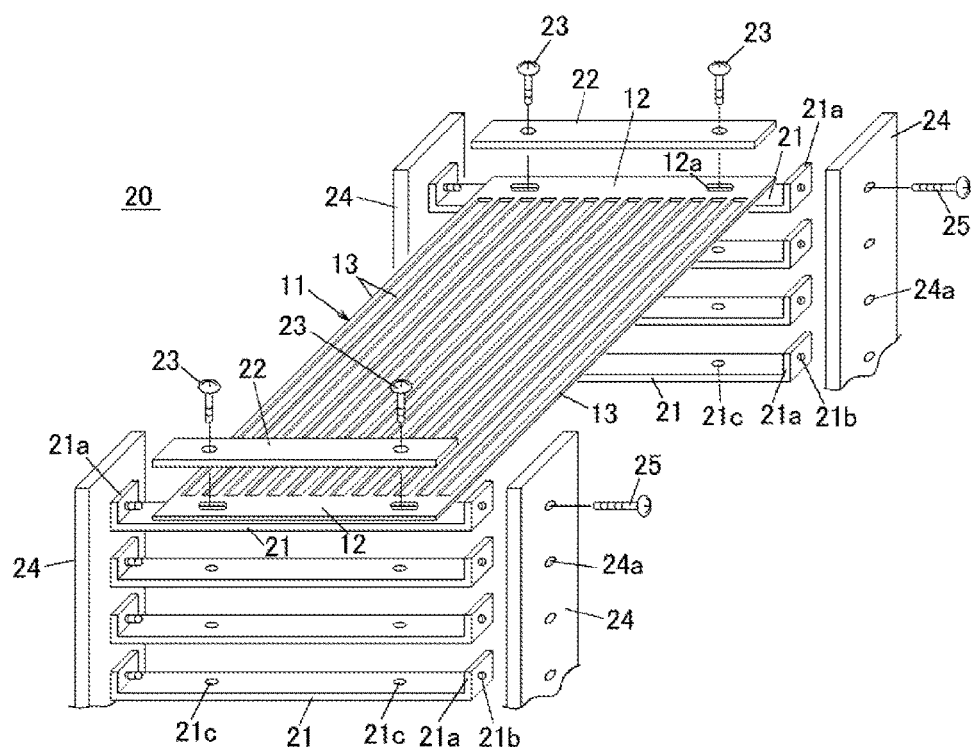
FIG. 8 is a perspective view of a wire assembly according to the second embodiment.

FIG. 8 shows a wire assembly according to a second embodiment. In FIG. 2, the wire assembly 10 is configured by stacking a plurality of wire jigs 11 with the spacer 15 interposed between each two wire jigs 11. However, the present disclosure is not limited to such a configuration. In a wire assembly 20 of this embodiment, as shown in FIG. 8, support jigs 21 for individually supporting frame portions 12 of the wire jigs 11 are provided, and both end portions 21a of each one of the plurality of supporting jigs 21 are fixed to side plates 24 which are arranged in an upright manner. To be more specific, the frame portion 12 of the wire jig 11 is fixed to the supporting jig 21 by screws 23 in a state where a backing plate 22 is arranged on the frame portion 12. It is preferable to form screw holes 21c with which the screws 23 are threadedly engaged in the supporting jig 21. In fixing the wire jig 11 to the supporting jigs 21, the position of the wire jig 11 may be adjusted in a direction orthogonal to a length direction of wires using elongated holes 12a formed in the frame portions 12. Both end portions 21a of the supporting jig 21 are raised upward, and threaded holes 21b are formed in both end portions 21a respectively. Insertion holes 24a are formed in the side plates 24, and screws 25 are threadedly engaged with the threaded holes 21b formed in both end portions 21a of the supporting jig 21 through the insertion holes 24a and hence, the supporting jig 21 can be fixed at a predetermined height in a horizontal posture. The plurality of insertion holes 24a are formed in the side plate 24 at predetermined intervals in the vertical direction, and a distance between the insertion holes 24a defines a distance between the wire jigs 11 arranged adjacently to each other in the vertical direction. The supporting jigs 21 and the side plates 24 are arranged on both end portions of the wire jigs 11 in a wire length direction (longitudinal direction) respectively. It is not necessary to arrange the plurality of side plates 24 in a separate manner in the longitudinal direction, and the side plates may have the integral structure.

In the case of this embodiment, a distance between the supporting jigs 21 arranged on both sides in the wire length direction can be adjusted by a distance between the side plates 24, and a distance between the supporting jigs 21 in the vertical direction can be set by the positions where the supporting jigs are mounted on the side plates 24. Accordingly, it is possible to adjust the slackening of the wire jig 11 and to adjust a distance between the wire jigs more easily compared to the case where the spacers are used.

Figure 9A:
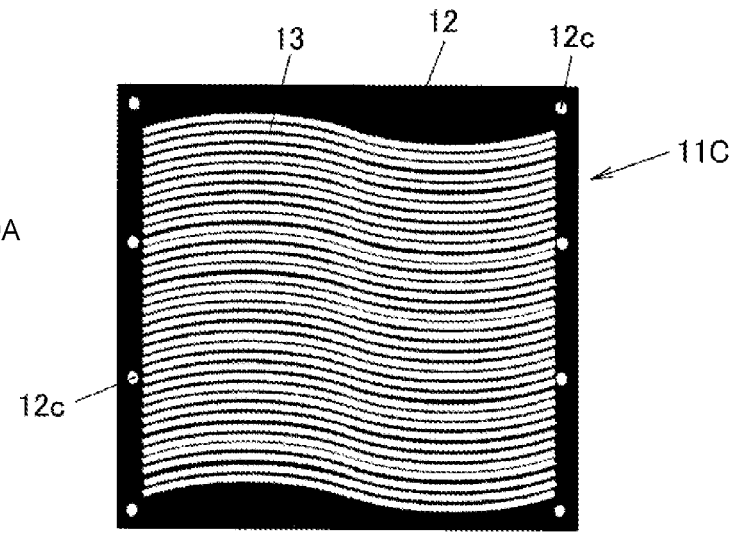
FIG. 9A and FIG. 9B are plan views of wire jigs according to fourth and fifth embodiments.
Figure 9B:
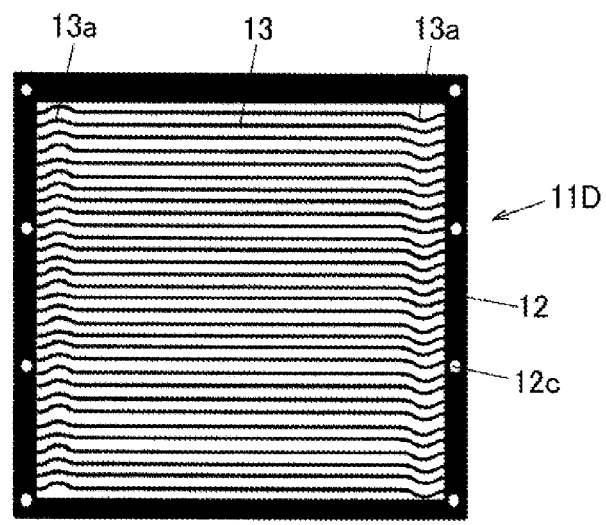
Figure 10:
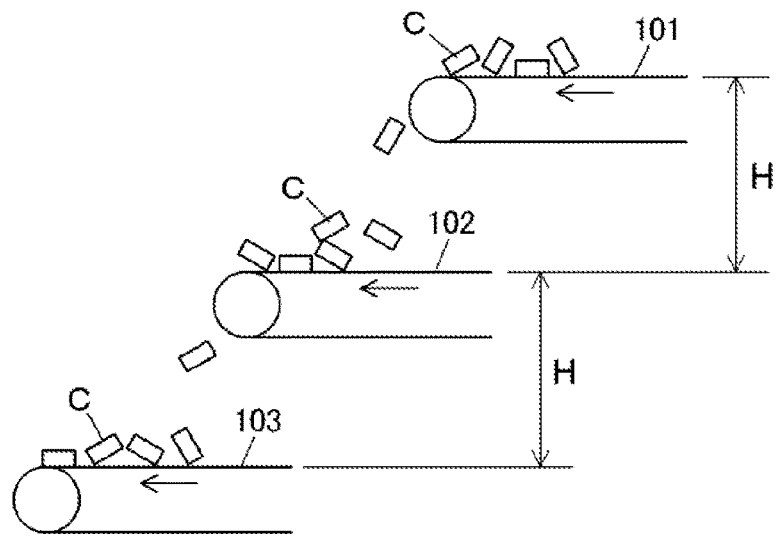
FIG. 10 is a schematic view showing one example of a conventional conveyance device.

FIG. 9A and FIG. 9B show a wire jig according to a fourth embodiment and a wire jig according to a fifth embodiment respectively. In the fourth and fifth embodiments, parts which are identical with or correspond to the parts of the first embodiment are given the same symbols, and the repeated description of these parts is omitted. In the wire jigs 11C, 11D of these embodiments, wires 13 having a curved shape (corrugated shape) or a bent shape are formed in a planar direction of a metal plate by an etching pattern. The frame portion 12 is formed over the whole circumference of the wire jigs 11C, 11D, and screw insertion holes 12c are formed in two opposite sides of the frame portion 12 respectively.

In the wire jig 11C, the wires 13 have a curved shape as a whole, and in the wire jig 11D, only both ends 13a of each straight wire 13 have a curved or bent shape. Since the wire 13 is configured to have a curved or bent shape wholly or partially, it is possible to impart elasticity to the wire 13 per se. By adjusting a ratio of a curved portion or a bent portion to a straight portion, a curvature or the degree of bending, a desired tensile strength can be acquired. With such a structure, even when the wire jig 11C, 11D is arranged in a planar shape without slackening the wire jig 11C, 11D, it is possible to individually impart elasticity to the wires 13 per se. Accordingly, it is possible to acquire an effect of suppressing the spring back of the chip component C when the chip component C collides with the wire 13.

In the above-mentioned embodiments, the description has been made with respect to the example where the wire jig is manufactured by etching a metal plate. However, the present disclosure is not limited to such a configuration, and a wire jig can be manufactured by applying mechanical working such as blanking, laser working or water jet working to a metal plate, a carbon fiber sheet or a resin sheet. Further, a wire jig can be manufactured also by integral molding of a resin. Further, although the wire jigs according to five embodiments have been described, other wire jigs can be formed by combining technical features of these embodiments to each other.

The chip component which is an object to which the present disclosure is applicable includes, besides a multilayer ceramic capacitor, chip components such as a chip resistor and a chip inductor. However, the chip component is not limited to a finished product (equipped with an external electrode), and may be a molded or fired intermediate part (not equipped with an external electrode). A shape of the chip component is not limited to a rectangular parallelepiped shape, and may be an arbitrary shape such as a circular columnar shape, a disc shape or a ring shape.

The invention claimed is:

1. A fall impact reducing apparatus for reducing an impact on a falling chip component, the fall impact reducing apparatus comprising
   a wire assembly formed by stacking a plurality of wire jigs, and
   each of the wire jigs including a plurality of wires arranged parallel to each other at intervals which allows the chip component to pass through the plurality of wires, and
   each of the wire jigs being formed of an integral body by working a base material having a predetermined thickness, the integral body being constituted of a pair of frame portions and the plurality of wires extending parallel to each other between the frame portions.

2. The fall impact reducing apparatus according to claim 1, wherein each of the wire jigs is formed by etching a metal plate.

3. The fall impact reducing apparatus according to claim 1, wherein the wires are arranged in a slackened state by fixing the frame portions of each of the wire jigs to support members which are arranged in a spaced-apart manner with a predetermined distance therebetween in a length direction of the wires.

4. The fall impact reducing apparatus according to claim 1, wherein the wires extending between the frame portions of each of the wire jigs are formed into a curved or bent shape in a plane direction of the base material.

5. The fall impact reducing apparatus according to claim 1, wherein a predetermined gap is formed between the wire jigs by stacking the plurality of wire jigs with a spacer between the frame portions, and by fastening the frame portions and the spacer to each other using a fastening jig.

6. The fall impact reducing apparatus according to claim 1,
   wherein an elongated hole extending in a direction orthogonal to a length direction of the wires is formed in the frame portions of each of the wire jigs, and
   positions of the wires of any pair of upper and lower wire jigs are displaced from each other in a direction orthogonal to the length direction of the wires by inserting a fastening jig into the elongated hole at the time of fastening the frame portions to a support member using the fastening jig.

7. The fall impact reducing apparatus according to claim 1,
   wherein a plurality of insertion holes arranged in a direction orthogonal to a length direction of the wires are formed in the frame portions of each of the wire jigs, and
   positions of the wires of any pair of upper and lower wire jigs are displaced from each other in a direction orthogonal to the length direction of the wires by inserting a fastening jig into any one of the plurality of insertion holes at the time of fastening the frame portions to a support member using the fastening jig.

8. A wire jig used in a fall impact reducing apparatus for reducing an impact on a falling chip component, the wire jig comprising
   a plurality of wires arranged parallel to each other at intervals which allow the chip component to pass through the plurality of wires, and
   an integral body formed by working a base material having a predetermined thickness, the integral body constituted of a pair of frame portions and the plurality of wires extending parallel to each other between the frame portions.

9. The fall impact reducing apparatus according to claim 1, wherein the plurality of wires are arranged to directly contact the falling chip component.

10. The fall impact reducing apparatus according to claim 8, wherein the plurality of wires are arranged to directly contact the falling chip component.

* * * * *